United States Patent
Lee et al.

(10) Patent No.: US 6,211,010 B1
(45) Date of Patent: Apr. 3, 2001

(54) METHOD OF FORMING HEMISPHERICAL GRAINS ON A SURFACE COMPRISING PRE-CLEANING THE SURFACE IN-SITU WITH PLASMA

(75) Inventors: Jang Hyeok Lee, Suwon; Se Hyoung Ryu, Yongin; Chan Sik Park, Suwon; Eung Yong Ahn, Suwon; Yun Young Kwon, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/451,842

(22) Filed: Dec. 1, 1999

(30) Foreign Application Priority Data

Apr. 26, 1999 (KR) .............................. 10-0014826

(51) Int. Cl.$^7$ ............................................... H01L 21/8242
(52) U.S. Cl. ........................................... 438/255; 438/398
(58) Field of Search .................................... 438/255, 398, 438/964

(56) References Cited

U.S. PATENT DOCUMENTS

| | | |
|---|---|---|
| 5,403,434 | 4/1995 | Moslehi . |
| 5,629,223 | 5/1997 | Thakur . |
| 5,634,974 | 6/1997 | Weimer et al. . |
| 5,696,014 | 12/1997 | Figura . |
| 5,753,559 | 5/1998 | Yew et al. . |
| 5,770,500 | 6/1998 | Batra et al. . |
| 5,877,052 | * 3/1999 | Lin et al. .............................. 438/238 |
| 5,882,979 | * 3/1999 | Ping et al. ............................ 438/398 |

* cited by examiner

Primary Examiner—Jey Tsai
(74) Attorney, Agent, or Firm—Jones Volentine, LLC

(57) ABSTRACT

A method of forming a hemispherical grain includes cleaning a polysilicon layer of a native oxide in-situ in the processing chamber of the HSG growth reactor. Such a native oxide adversely affects the growing of HSGs from seeds during the thermal treatment performed in the processing chamber. The cleaning is carried out by dry etching the polysilicon layer with plasma. The plasma may be produced from a mixture of fluorine and inert gases having a volumetric ratio within the range of 0.2:100 to 25:100. Such a plasma can be formed by ionizing the gas with an RF power within a range of 20 to 500 Watts. An advantage of using plasma etching to clean the polysilicon of a native oxide is that the plasma etching is an anisotropic process. The present invention is thus particularly useful in the manufacture of a DRAM capacitor. In such a case, the hemispherical grains at neighboring side walls of the DRAM capacitor have a smaller average grain size than that of the hemispherical grains at the upper surfaces of the capacitor. The smaller HSGs are less likely to bridge, and yet the capacitor may still have some comparatively large grains contributing to the increased capacitance provided by the HSGs.

24 Claims, 8 Drawing Sheets

METHOD OF FORMING HEMISPHERICAL GRAINS ON A SURFACE COMPRISING PRE-CLEANING THE SURFACE IN-SITU WITH PLASMA

BACKGROUND OF THE INVENTION

1. Field of The Invention

The present invention generally relates to a method of forming a hemispherical grain (HSG) on silicon. More particularly, the present invention relates to a method of forming an HSG on silicon which involves pre-cleaning the surface of the silicon prior to the heat treatment used to transform a seed into a hemispherical grain.

2. Detailed Description Of The Related Art

As the size of semiconductor devices becomes scaled down, the space available for the memory cell capacitor of a dynamic random access memory (DRAM) decreases accordingly. However, such scaled down semiconductor devices must have a large capacitance sufficient to guarantee a proper read/write operation of the DRAM.

Accordingly, a great deal of effort has been expended in achieving a larger capacitance within a limited area. Major approaches employed in the semiconductor industry for this purpose are: (1) reducing the thickness of the dielectric film, (2) increasing the effective surface area of the storage node, and (3) selecting a material with a high dielectric constant.

One method of increasing the effective surface area of the storage node involves forming hemispherical grains (HSGs) on the surface of a storage node. Conventionally, a hemispherical grain is formed by depositing a seed on polysilicon used to form the storage node, and then thermally treating the seed. Details of such a process for forming hemispherical grains are disclosed in U.S. Pat. Nos. 5,696,014, 5,629,223, and 5,770,500.

The prior art method for forming the HSGs on the silicon includes a preparatory step of cleaning the surface of the wafer by wet etching. The preparatory cleaning process is necessary for HSG growth because it enhances the migration of a silicon atom during the subsequent heat treatment.

A consequence of the wet etch cleaning process of the prior art is hydrogen termination of the amorphous silicon on the wafer. The prior art still has the following problems that must be resolved before a high-quality HSG can be grown.

First of all, the pre-cleaned wafers are exposed to the atmosphere when they are in a stand-by state just prior to being loaded into an HSG growth chamber. As a result, a native oxide can be formed on the surface of the wafer even if the wafer is pre-cleaned by being wet etched.

Furthermore, if the entire process of growing HSGs is performed in a fully automatic manufacturing line, the time shift between the equipment of the line makes it difficult to prevent the growth of a native oxide on the pre-cleaned surface of the wafer. The formation of a native oxide, in turn, makes it difficult to grow a high-quality HSG on the surface of the underlying film. Still further, a bridging phenomena can occur between neighboring storage nodes due to the selective loss.

Figure 1:
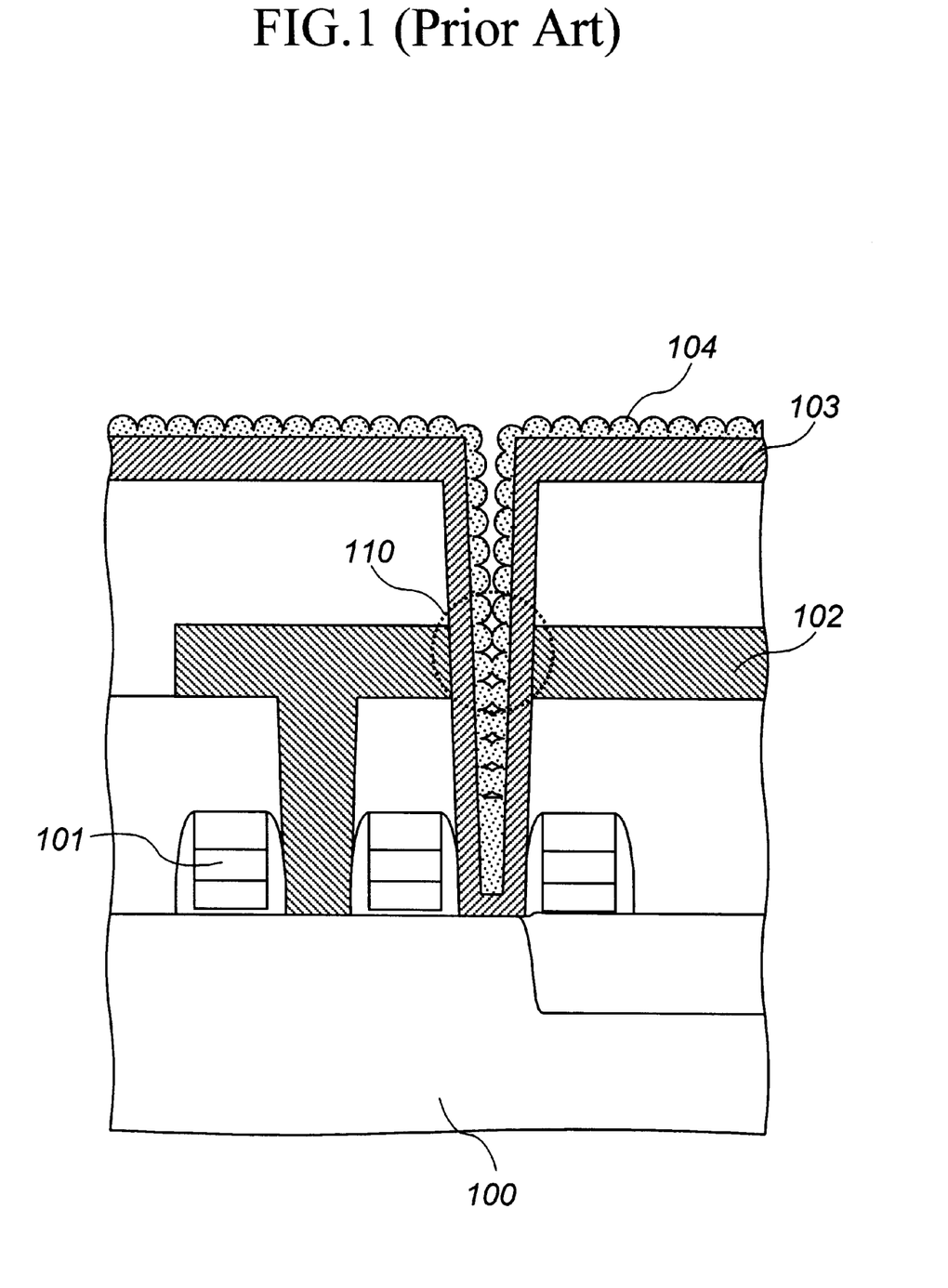
FIG. 1 is a schematic cross-sectional view of a conventional HSG cell capacitor exhibiting a bridging problem.

FIG. 1 is a schematic diagram showing the existence of bridging of HSGs between adjacent storage nodes when the prior art method is practiced.

Referring to FIG. 1, the semiconductor device includes a gate structure 101 formed on substrate 100, a bit line 102, and a storage node 103 on which HSGs 104 have been formed in accordance with the prior art. Reference numeral 110 designates an area between neighboring nodes where bridging occurs. It is easily understood why such bridging becomes more prevalent as the pitch of the nodes becomes smaller with the scaling down of the device.

Figure 2:
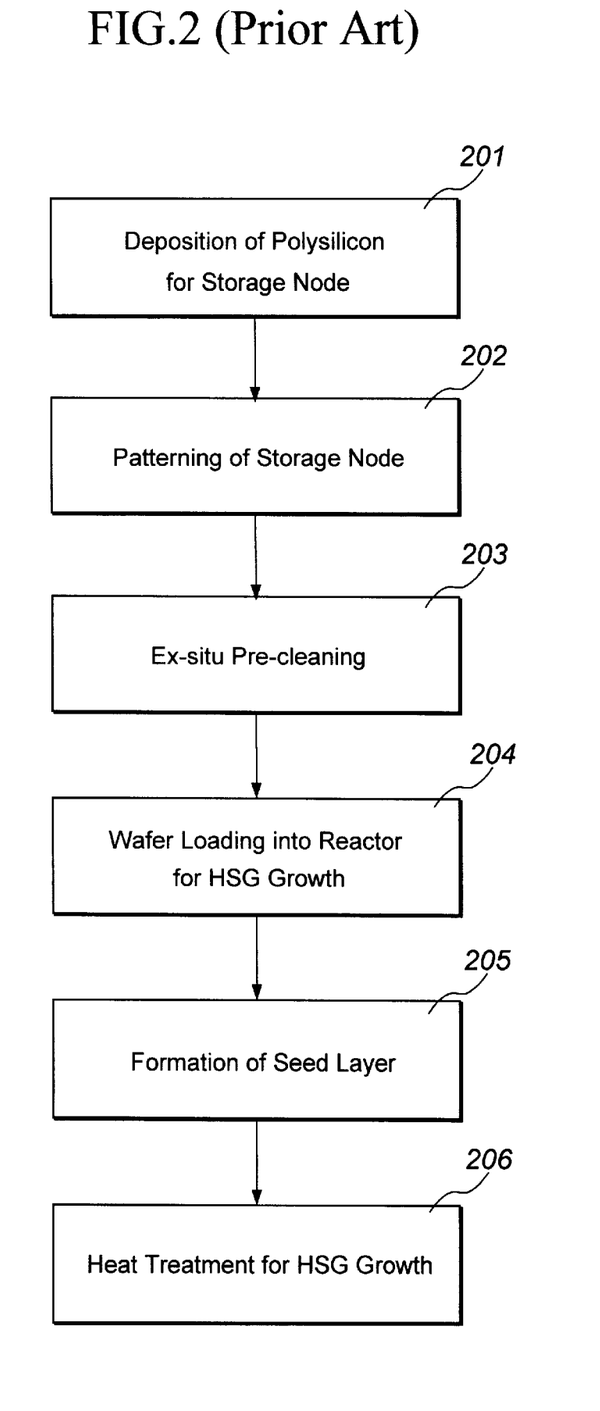
FIG. 2 is a flow diagram of the process of forming HSGs in accordance with the prior art.
Figure 3:
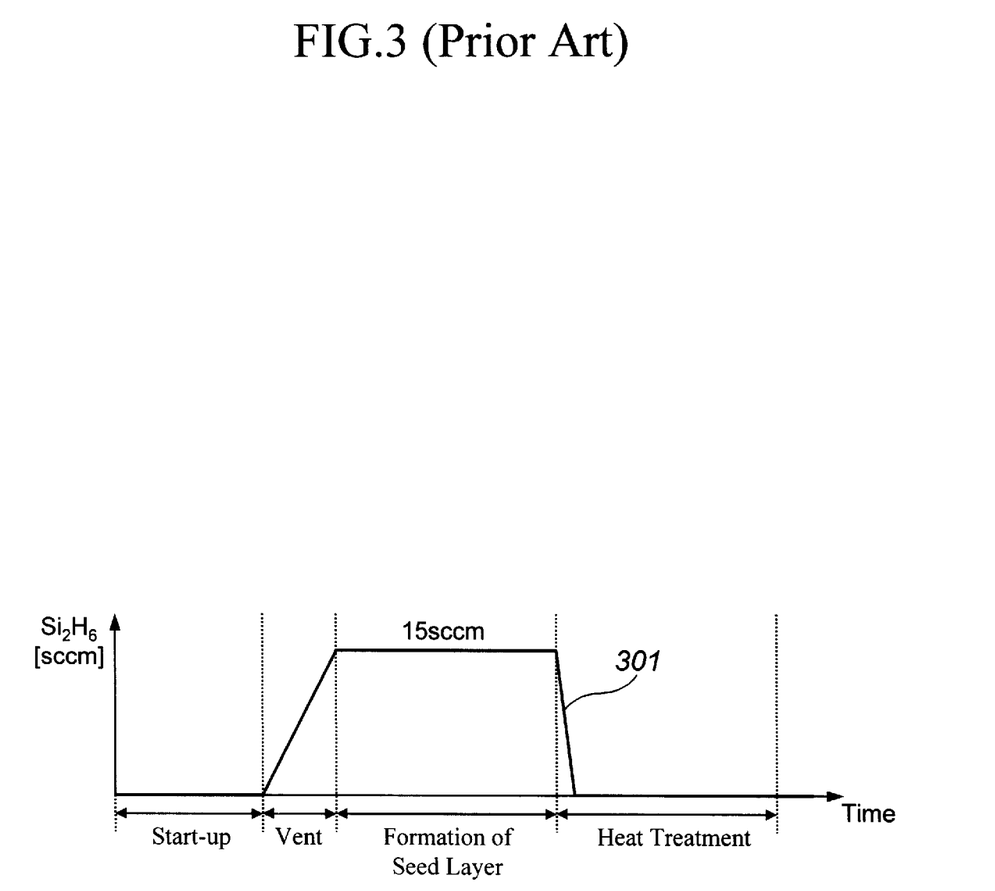
FIG. 3 is a graph showing the flow rate of $Si_2H_6$ gas during phases of the process of forming HSGs in accordance with the prior art.

FIG. 2 is a flow diagram illustrating the process of forming HSGs according to the prior art. Referring to this figure, a polysilicon layer is deposited (step 201) on a wafer and patterned (step 202) to form the lower electrode of a cell capacitor. After the wafer is cleaned ex-situ (step 203) by a wet etch process, the wafer is loaded into an HSG growth reactor (step 204). Subsequently, the polysilicon is seeded (step 205) using $Si_2H_6$ gas to form polysilicon nuclei on the surface of the polysilicon. The flow rate (301 of FIG. 3) of the $Si_2H_6$ gas is ramped up during a ventilation step and is maintained at 15 sccm during seed formation. The polysilicon nuclei are transformed into HSGs by thermally treating them in the reactor (step 206). FIG. 3 is a graphical representation of the HSG growth process according to the prior art. The traditional HSG growth process has discrete start-up, ventilation, formation of seeded layer, and heat treatment stages.

The prior art experiences its severe problem of native oxide formation on the surface of the patterned polysilicon storage node, when the wafer is exposed to air for more than ten minutes between the ex-situ pre-cleaning of the wafer and the loading of the wafer into the HSG growth reactor. As mentioned above, the situation worsens when factory automation carries out the semiconductor processing steps because with such factory automation, the wafer is inevitably exposed to the air.

The presence of the native oxide on the surface of the polysilicon storage node prevents the growth of the HSGs. Furthermore, because the spacing between the adjacent storage nodes may be on the order of a deep-sub-half-micrometer scale, the HSG grains grown on the vertical wall of a storage node can bridge those formed on the neighboring node.

SUMMARY OF THE INVENTION

Accordingly, it is an object of the present invention to prevent a native oxide from interfering with the formation of hemispherical grains in the manufacturing of semiconductor devices.

It is also an object of the present invention to prevent the bridging of hemispherical grains in the manufacture of capacitors of semiconductor devices.

To achieve these objects, the present invention comprises a step of in-situ cleaning the wafer with plasma. The plasma may be produced from a mixture of fluorine and inert gases having a volumetric ratio within the range of 0.2:100 to 25:100. The plasma is formed by ionizing the gas with an RF power within a range of 20 to 500 Watts.

An advantage of using plasma etching to clean the polysilicon of a native oxide is that the degree of in-situ plasma cleaning may vary amongst the various surfaces of polysilicon. That is, the plasma cleaning is an anisotropic process.

For example, when such a cleaning process is used as a pre-cleaning process in the manufacture of a DRAM capacitor, the hemispherical grains at neighboring side walls of the DRAM capacitor are smaller than those at the upper surfaces of the capacitor. The smaller HSGs are less likely to bridge, and yet the capacitor may still have some comparatively large grains contributing to the increased capacitance provided by the HSGs.

BRIEF DESCRIPTION OF THE DRAWINGS

These and other objects, features and advantages of the present invention will be better understood from the following detailed description of the preferred embodiments. Such description of the preferred embodiments is made with reference to the accompanying drawings, of which.

DETAILED DESCRIPTION OF THE PREFERRED EMBODIMENTS

Figure 4:
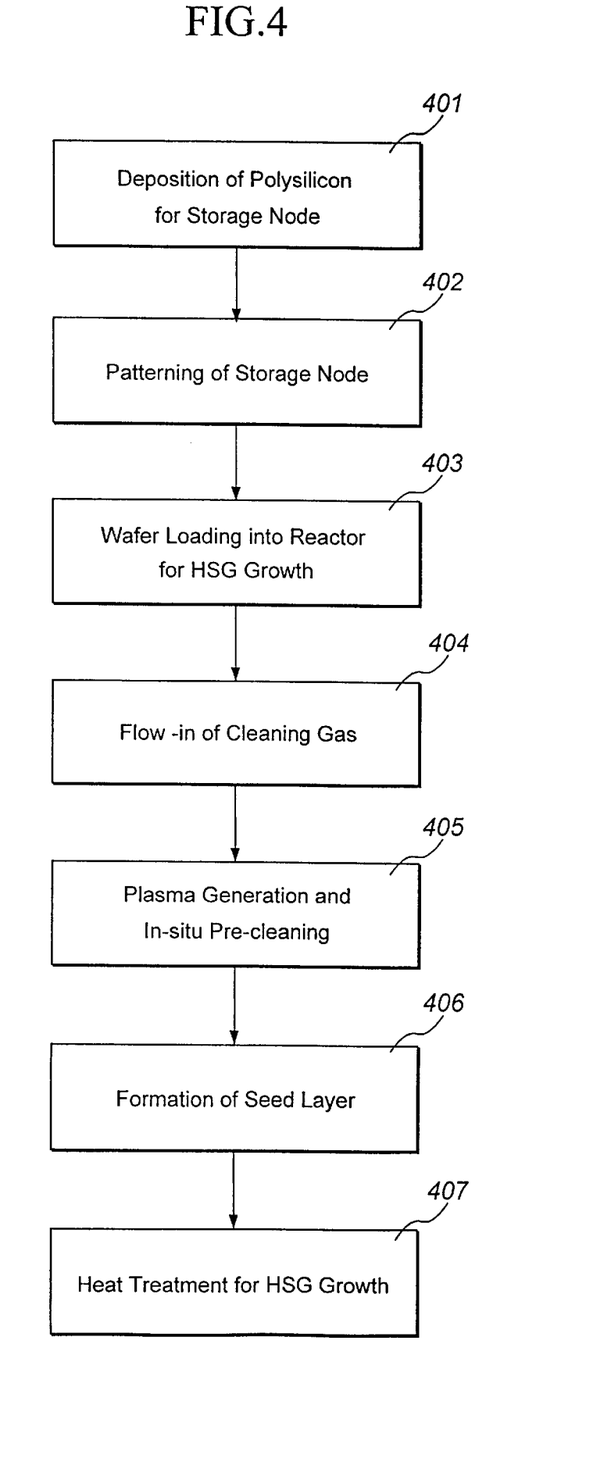
FIG. 4 is a flow diagram of an embodiment of the process of forming HSGs in accordance with the present invention.

FIG. 4 illustrates the process flow of the present invention. Referring to FIG. 4, a polysilicon layer is formed over a semiconductor substrate (step 401), and is subsequently patterned (step 402) for defining storage nodes of a capacitor. Thereafter, the wafer is loaded into an HSG growth reactor (step 403).

Next, a gas or gas mixture is fed into the HSG growth reactor (step 404). The chamber is ventilated for about 5 minutes to facilitate a stable flow of the gas. Preferably, a mixture of fluorine and inert gases is introduced into the reactor. The fluorine gas can be at least one gas selected from the group consisting of $SF_6$, $Cl_2$, $NF_3$, $H_2$, and $Cl_4$. On the other hand, the inert gas can be at least one gas selected from the group consisting of Ar, He, Ne, Kr, Xe, Rn, and N.

When RF power is supplied to the growth reactor, a plasma is formed of ionized fluorine gas. Such plasma is capable of attacking the surface of the wafer for cleaning purposes. $SF_6$ is preferably employed as the fluorine gas of the cleaning gas. In this respect, the mean lifetime and the diffusion coefficient of the fluorine atom is 0.3 sec and 500 $cm^2$/sec, respectively. Therefore, the fluorine atom can be moved about 25 cm in the reactor under a pressure of 1 Torr.

The RF power for producing the plasma should be in the range of 20 to 500 Watts. The surface of the wafer can be in-situ cleaned (step 405) in the growth reactor by the plasma by lifting the susceptor chuck of the reactor such that the wafer is located within the diffusion length of the ionized atoms.

After the growth reactor is ventilated to remove the cleaning gases therefrom, a seeded layer is formed on the polysilicon (step 406). Preferably, $Si_2H_6$ gas is introduced into the growth reactor to form polysilicon nuclei. The polysilicon nuclei are then transformed into hemispherical grains (step 407) by a heat treatment process carried out in the growth reactor.

Figure 5:
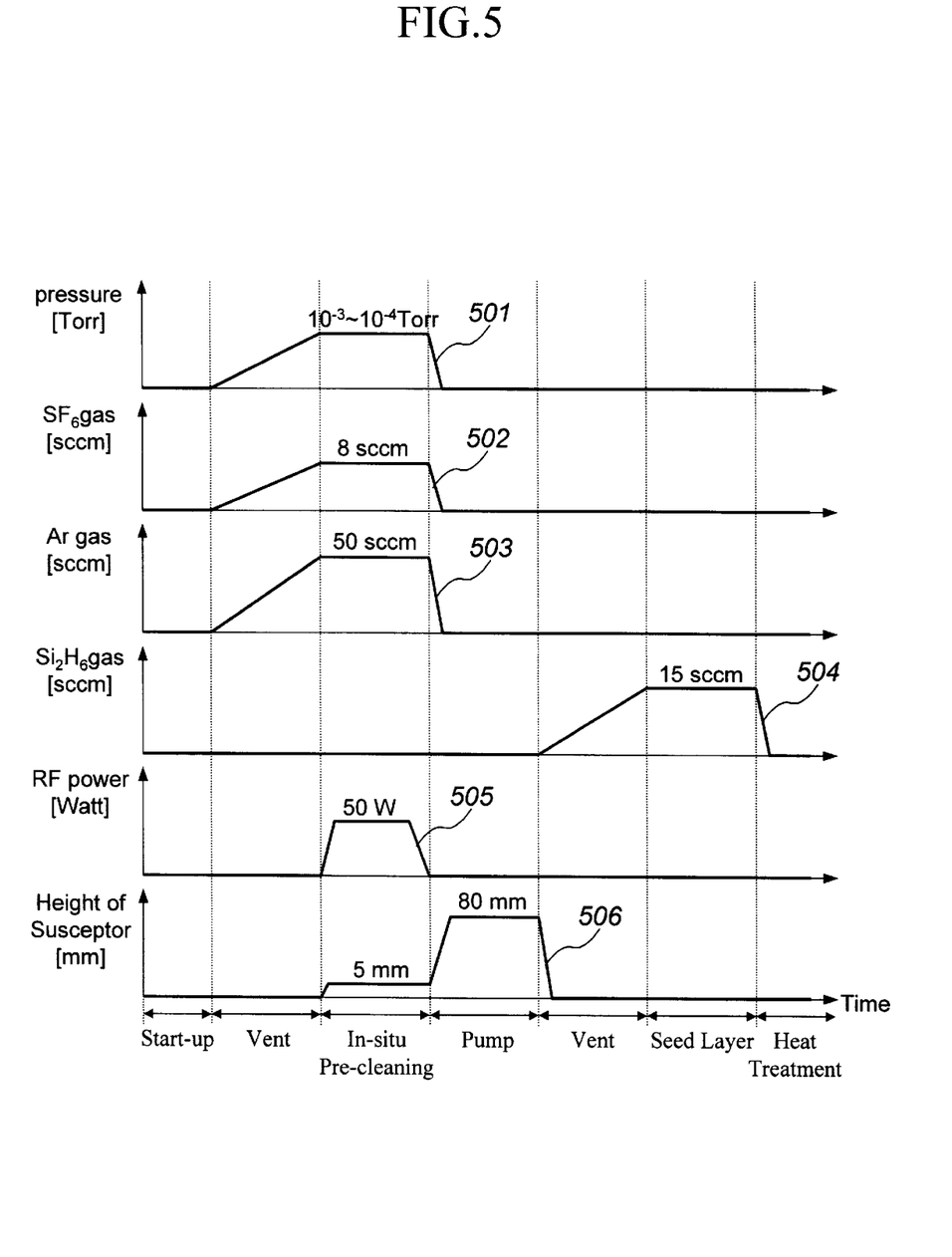
FIG. 5 is a timing diagram of the process of forming HSGs in accordance with the present invention.

FIG. 5 illustrates the process conditions for forming HSGs according to one embodiment of the present invention.

Referring to FIG. 5, the cleaning gas is a mixture of $SF_6$ and Ar. The temperature is maintained to within 600 to 800° C. after a ramping up step. During in-situ cleaning, the $SF_6$ and Ar gas mixture is introduced into the chamber of the growth reactor while the pressure (501) of the chamber is maintained to within $10^{-3}$ to $10^{-4}$ Torr. The flow rate (502) of the $SF_6$ is kept to within 1.0 to 200 sccm, and the flow rate (503) of the Ar is kept to within 10 to 300 sccm. Furthermore, the volume ratio of the mixture of $SF_6$ and Ar is preferably within a range of from 100:0.2 to 100:25.

Now, still referring to FIG. 5, plasma is produced by introducing $SF_6$ into the chamber at a flow rate of 8 sccm, Ar at a flow rate of 50 sccm, and supplying an RF power of 50 Watts (505).

The flow rate of the cleaning gas must be optimized and controlled because, on the one hand, if the flow rate of $SF_6$ is insufficient, a failure in the HSG growth stage can be observed due to a native oxide remaining on the surface of the polysilicon. On the other hand, if the flow rate of $SF_6$ is excessive, sidewall redeposition can occur due to an overetching of the underlying layer. This, of course, also results in a failure in the HSG growth stage.

The in-situ plasma cleaning time is preferably within a range of 5 to 60 seconds. The total time, from the start-up stage to the in-situ cleaning stage, is approximately 100 seconds.

Furthermore, the height of the susceptor chuck can be raised or lowered by a given amount (506) during the various stages of the method according to the present invention. The susceptor chuck is raised 0 to 20 mm from its home position during in-situ cleaning. In the preferred embodiment, the susceptor chuck is raised 5 mm toward the area in the chamber where the plasma is produced for the in-situ cleaning process. When the in-situ cleaning process is finished, the $SF_6$ and Ar gases are pumped out of the chamber of the growth reactor. During this stage, the susceptor chuck is preferably located 50 to 100 mm above its home position. More preferably, the susceptor chuck is located 80 mm above its home position.

Thereafter, a polysilicon nucleus is formed by introducing $Si_2H_6$ gas into the chamber of the growth reactor. Preferably, the $Si_2H_6$ gas is introduced into the chamber during seeding at a flow rate (504) of 15 sccm for 150 seconds.

Then, the polysilicon nucleus is transformed into a hemispherical grain by performing a heat treatment. In the preferred embodiment, the heat treatment is performed at 600 to 800° C. for 250 seconds.

Figure 6:
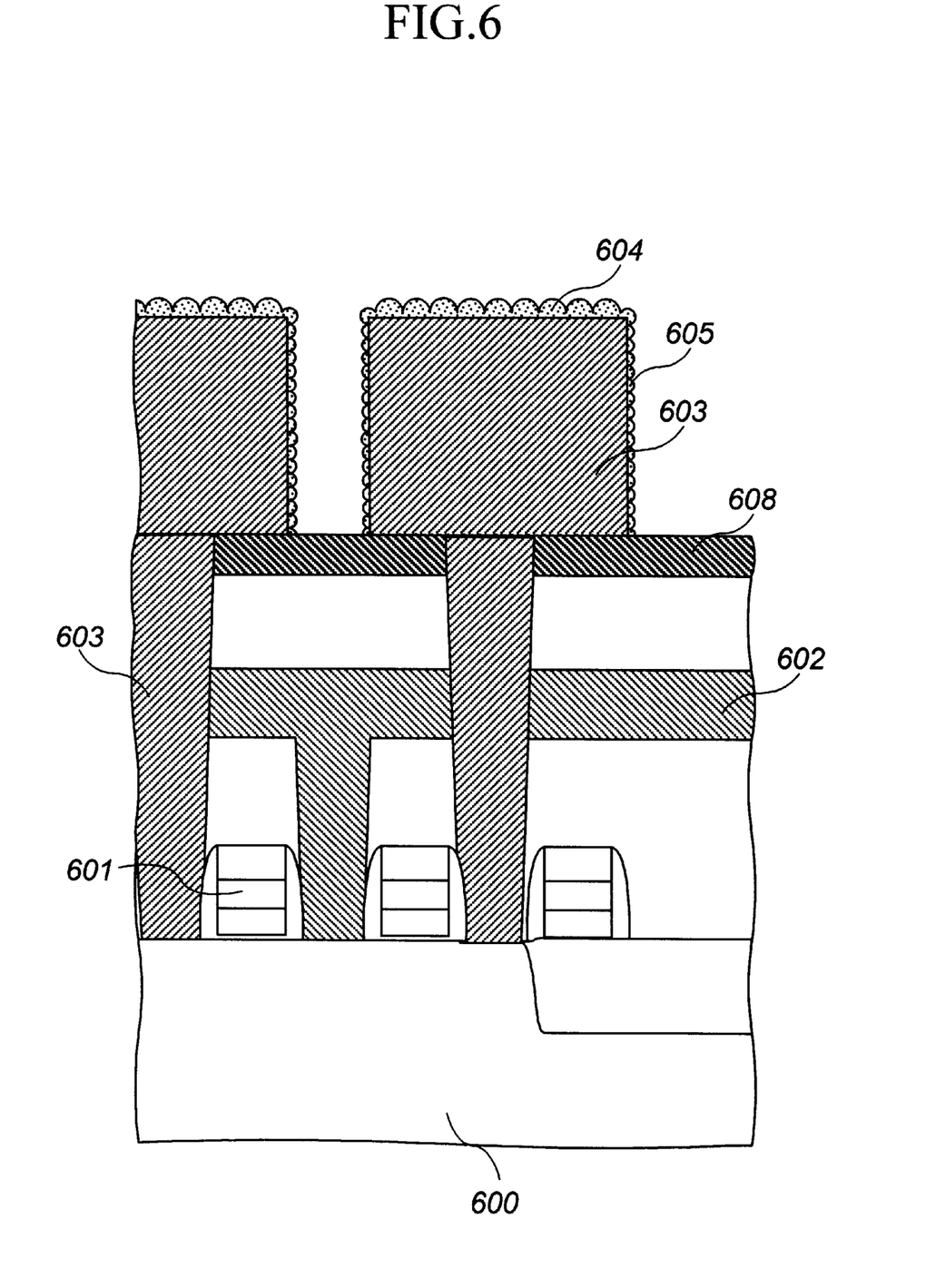
FIG. 6 is a schematic cross-sectional view of an HSG cell capacitor manufactured in accordance with the present invention.

FIG. 6 shows an HSG cell capacitor manufactured in accordance with the present invention. In this capacitor, a gate structure 601, a storage node 603, and a bit line 602 are formed on a substrate 600. Note, the size of the hemispherical grains may vary locally when using the method according to the present invention. For example, the grains 604 formed on the top surface of the storage node 603 are larger than the grains 605 formed on the sidewall of the storage node 603. This is due to the fact that the top surface of the storage node 603 is cleaned more profoundly than the surface of the sidewall during the anisotropic in-situ plasma cleaning stage. As a result, less native oxide remains on the top surface than on the sidewall. Consequently, the grains grown on the top surface become larger than those grown on the sidewall. This unique feature of forming HSGs of various sizes can be applied successfully to the manufacture of deep-sub-half-micrometer DRAM cell capacitors to resolve the problem of bridging between the neighboring nodes.

Figure 7:
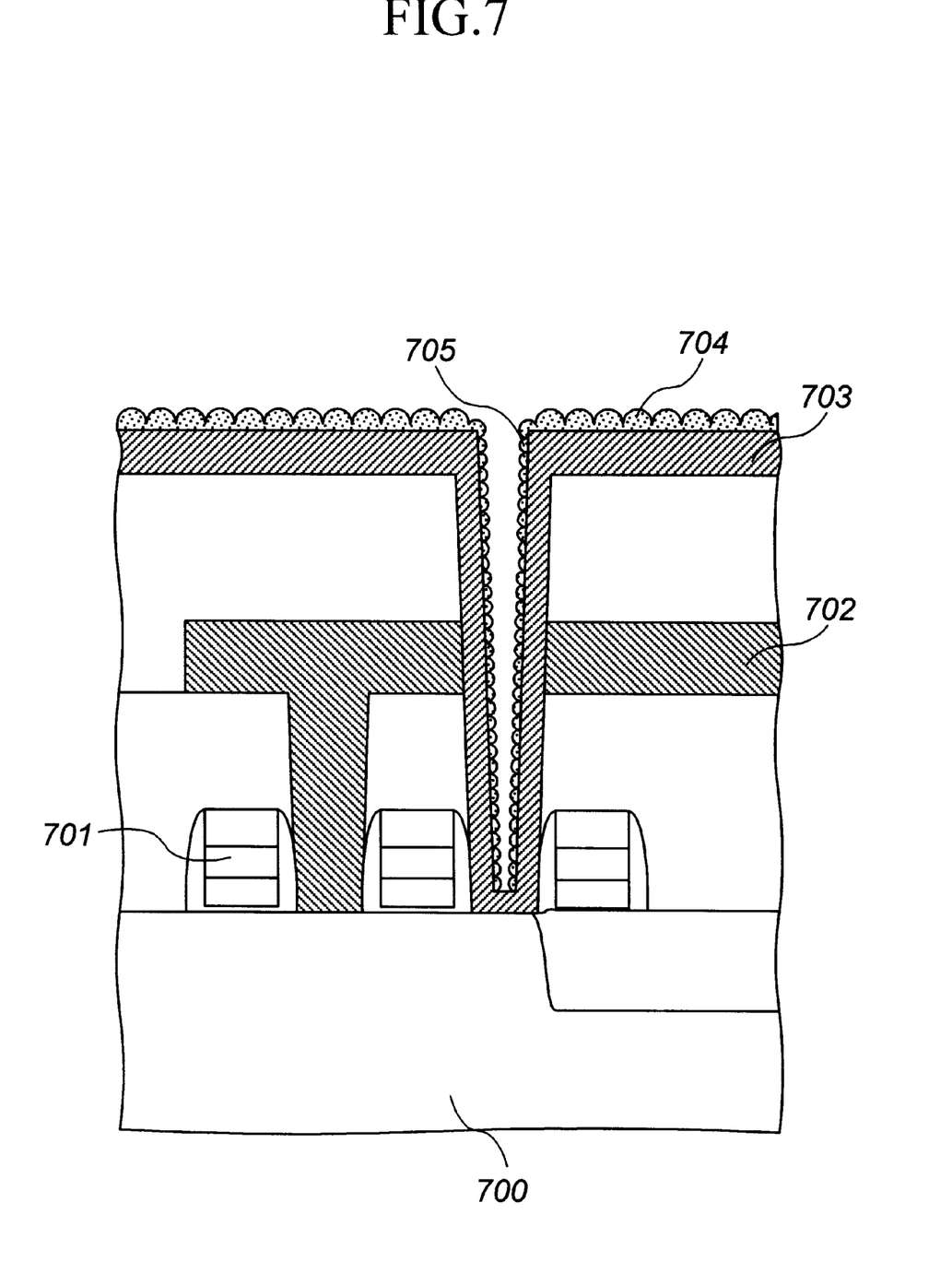
FIG. 7 is a schematic cross-sectional view of an HSG trench capacitor manufactured in accordance with the present invention.

FIG. 7 shows such an HSG trench capacitor manufactured in accordance with the present invention. In this figure, a gate structure 701, a bit line 702, and a storage node 703 are formed on a substrate 700.

Because the size of the HSGs depends on the amount of native oxide remaining on the surfaces of the semiconductor device after the in-situ plasma cleaning, the trench capacitor can be made in such a way that bridging between the HSGs on the adjacent sidewalls of the trench does not occur. Note, the size of the hemispherical grains may vary locally when using the method according to the present invention. For example, the grains 704 formed on the top surface of the storage node 703 are larger than the grains 705 formed on the sidewall of the storage node 703. As described previously, this is due to the fact that the top surface of the storage node 703 is cleaned more profoundly than the surface of the sidewall during the anisotropic in-situ plasma cleaning stage. As a result, less native oxide remains on the top surface than on the sidewall. Consequently, the grains grown on the top surface become larger than those grown on the sidewall.

Figure 8:
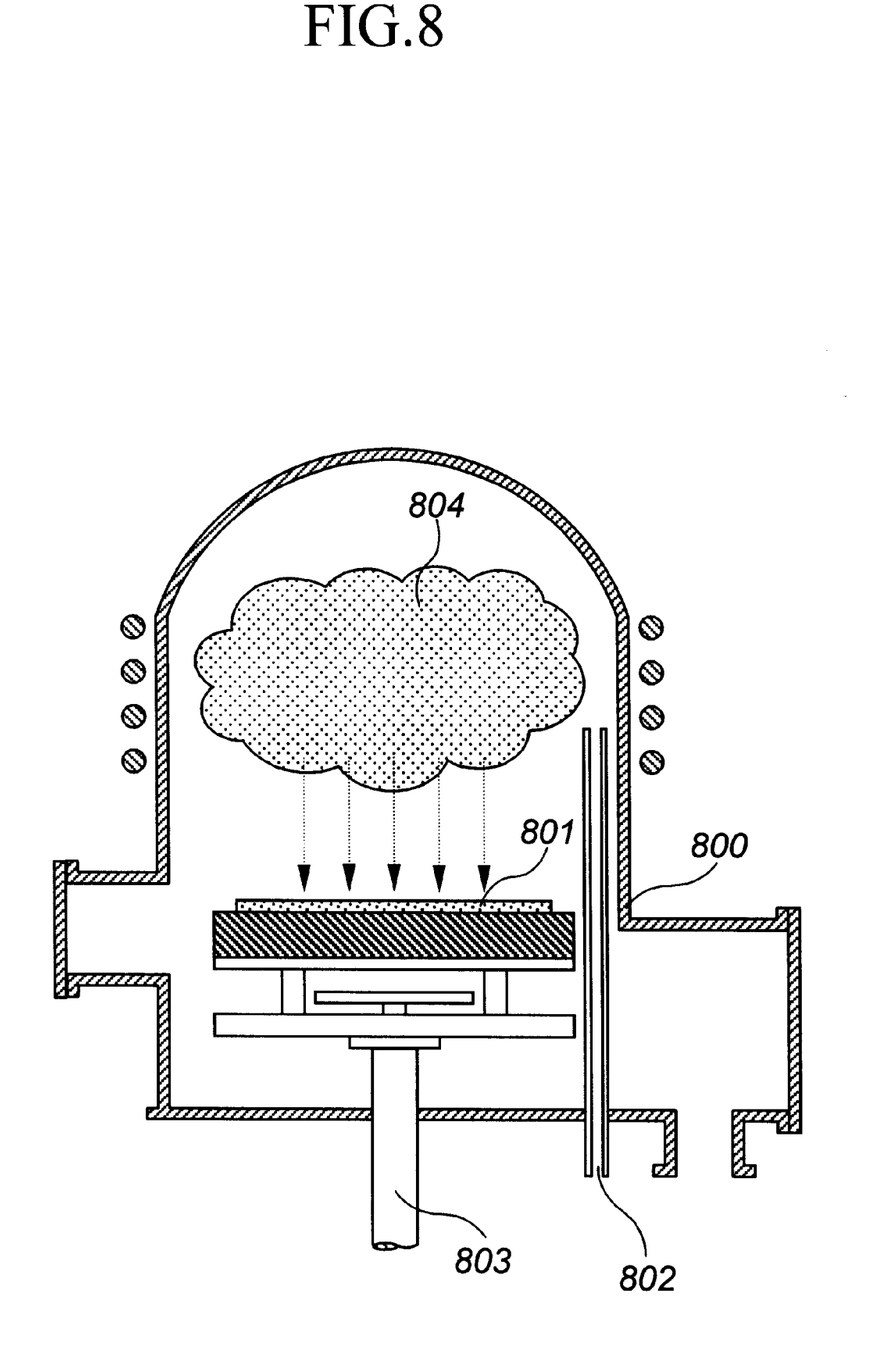
FIG. 8 is a schematic cross-sectional view of an HSG growth reactor illustrating the in-situ plasma cleaning in accordance with the present invention.

FIG. 8 is a schematic cross-sectional view of the HSG growth reactor illustrating the in-situ plasma cleaning process in accordance with the present invention.

FIG. 8 depicts an HSG growth reactor 800 suitable for the present invention. The reactor includes a gas inlet 802 through which the gas mixture of $SF_6$ and Ar can be supplied into the processing chamber of the reactor. During this time, the height of the susceptor chuck holding the wafer 801 can be maintained at 0 mm relative to a home position of the chuck.

The plasma 804 is produced by supplying RF power via a coil extending around the processing chamber. The wafer 801 is cleaned by exposing the wafer to the plasma by lifting the susceptor chuck 803 toward the plasma by a distance of 0 to 20 mm.

Although the invention has been illustrated and described with respect to preferred embodiments thereof, various changes, omissions and additions may be made thereto without departing from the true spirit and scope of the present invention as defined by the appended claims.

What is claimed is:

1. A method of forming hemispherical grains on a substrate, said method comprising the steps of:

forming a polysilicon layer on the substrate;

patterning the polysilicon layer to form a storage node;

cleaning the patterned polysilicon layer, in-situ in a processing chamber of an HSG growth reactor, of a contaminant affecting the growth of HSGs on the polysilicon layer;

forming seeds of hemispherical grains on the patterned silicon layer in the processing chamber of the HSG reactor; and transforming the seeds into hemispherical grains in the processing chamber of the HSG growth reactor.

2. The method of claim 1, wherein said step of cleaning comprises a dry etching process.

3. The method of claim 2, wherein said step of cleaning comprises introducing a mixture of fluorine and inert gases into the processing chamber of the HSG growth reactor.

4. The method of claim 3, wherein said mixture comprises a gas selected from the group consisting of $SF_6$, $Cl_2$, $ClF_3$, $NF_3$, $H_2$, and $Cl_4$.

5. The method of claim 4, wherein said inert gas consists of at least one gas selected from the group consisting of He, Ne, Ar, Kr, Xe, Rn, and N.

6. The method of claim 1, wherein said step of cleaning comprises introducing a gaseous mixture of $SF_6$ and Ar, with a volumetric ratio of 0.2:100 to 25:100, into the processing chamber of the HSG growth reactor.

7. The method of claim 1, wherein said step of cleaning comprises anisotropically cleaning local surfaces of the polysilicon.

8. The method of claim 1, wherein said step of forming a polysilicon layer comprises depositing polysilicon on one of a nitride compound layer and an oxide compound layer.

9. The method of claim 1, wherein said step of cleaning comprises maintaining a pressure of $10^{-3}$ to $10^{-4}$ Torr within the processing chamber of the HSG growth reactor.

10. The method of claim 1, wherein said step of cleaning comprises maintaining a temperature of 500 to 700° C. within the processing chamber of the HSG growth reactor.

11. The method of claim 1, wherein said step of cleaning is carried out for 5 to 60 seconds.

12. The method of claim 1, wherein said step of cleaning comprises producing plasma in the processing chamber of the HSG growth reactor and exposing the polysilicon layer to the plasma.

13. The method of claim 1, wherein said step of cleaning comprises introducing gas into the processing chamber of the HSG growth reactor, ionizing the gas using an RF power of 20 to 50 Watts to produce plasma, and dry etching the polysilicon in the processing chamber with the plasma.

14. The method of claim 1, wherein said step of cleaning comprises introducing gas into the processing chamber of the HSG growth reactor at a flow rate of 1 to 200 sccm.

15. The method of claim 1, wherein said step of cleaning comprises introducing Ar gas into the processing chamber of the HSG growth reactor at a flow rate of 10 to 300 sccm.

16. A method of forming hemispherical grains on a semiconductor substrate, said method comprising steps of:

loading a semiconductor substrate into a processing chamber of an HSG growth reactor;

supplying a cleaning gas and an inert gas into the processing chamber of the HSG growth reactor;

producing plasma from the cleaning gas and the inert gas;

exposing surfaces on the semiconductor substrate, in-situ in the processing chamber of the HSG growth reactor, to the plasma produced from the cleaning gas and inert gas, to thereby remove from the surfaces a contaminant affecting the growth of hemispherical grains;

removing the cleaning gas and inert gas from the processing chamber of the HSG growth reactor;

introducing a seeding gas for HSG growth into the processing chamber of the HSG growth reactor;

forming seeds of HSGs on the substrate; and transforming the seeds into hemispherical grains.

17. The method of claim 16, wherein said step of supplying the cleaning gas and the inert gas comprises introducing $SF_6$ at a flow rate of 1 to 200 sccm and Ar at a flow rate of 10 to 300 sccm, and with a volumetric ratio of 0.25:100 to 25:100, into the processing chamber of the HSG growth reactor.

18. The method of claim 16, wherein said step of producing plasma comprises providing an RF power of 20 to 500 Watts while maintaining a pressure of 0.01 to 0.001 Torr within the processing chamber of the HSG growth reactor.

19. The method of claim 16, and further comprising steps of raising the susceptor chuck 50 to 100 mm and turning off the RF power before the cleaning gas and the inert gas are removed from the processing chamber of the HSG growth reactor.

20. The method of claim 16, wherein said steps of producing plasma and exposing surfaces of the semiconductor substrate to the plasma comprise anisotropically cleaning the surfaces of a native oxide.

21. The method of claim 16, wherein the step of exposing comprises exposing the surfaces to the plasma for 5 to 60 seconds.

22. A method of forming a storage capacitor of a semiconductor device, said method comprising steps of:
    forming a polysilicon layer over a semiconductor substrate;
    patterning the polysilicon layer to form therefrom adjacent storage nodes each constituting a side wall and a top wall of a capacitor;
    loading the patterned semiconductor substrate into a processing chamber of an HSG growth reactor, whereby exposure of the polysilicon to the air prior to loading produces a native oxide on the polysilicon;
    introducing gas into the processing chamber;
    ionizing the gas to produce plasma in the processing chamber, and etching the storage nodes with the plasma to remove the native oxide therefrom;
    subsequently forming seeds of hemispherical grains on the storage nodes in the processing chamber of the HSG reactor; and
    thermally treating the seeds in the processing chamber to grow the seeds into hemispherical grains.

23. The method of claim 22, wherein said steps of forming a polysilicon layer and patterning the layer comprises forming a U-shaped trench, said step of etching comprises anisotropically etching the polysilicon to remove more of the native oxide from the side walls than from the top walls, and said step of forming seeds comprises seeding the top walls and the side walls of the patterned polysilicon together, whereby the hemispherical grains formed at the side walls have a smaller average grain size than those formed at the top walls.

24. The method of claim 22, wherein said steps of forming a polysilicon layer and patterning the layer comprises forming spaced apart cells defining the top walls and adjacent side walls, said step of etching comprises anistropically etching the polysilicon to remove more of the native oxide from the side walls than from the top walls, and said step of forming seeds comprises seeding the top walls and the side walls of the patterned polysilicon together, whereby the hemispherical grains formed at the side walls have a smaller average grain size than those formed at the top walls.

\* \* \* \* \*